Aug. 2, 1960 B. I. BERTELSEN 2,947,625

METHOD OF MANUFACTURING PRINTED CIRCUITS

Filed Dec. 21, 1955 3 Sheets-Sheet 1

INVENTOR.
BRUCE I. BERTELSEN

BY

J. Janein Jr.

ATTORNEY

INVENTOR.
BRUCE I. BERTELSEN
BY
J. Jancin Jr.
ATTORNEY

METHOD OF MANUFACTURING PRINTED CIRCUITS

Filed Dec. 21, 1955 3 Sheets-Sheet 3

INVENTOR.
BRUCE I. BERTELSEN

BY

J. Jancin Jr.

ATTORNEY

United States Patent Office 2,947,625

Patented Aug. 2, 1960

2,947,625

METHOD OF MANUFACTURING PRINTED CIRCUITS

Bruce I. Bertelsen, Vestal, N.Y., assignor to International Business Machines Corporation, New York, N.Y., a corporation of New York Filed Dec. 21, 1955, Ser. No. 554,510

4 Claims. (Cl. 96—1)

This invention relates to the manufacture of electric printed circuits, and has for its broad object the provision of an improved method of manufacturing printed circuits.

Another object of this invention is to provide a printed circuit manufacturing process which facilitates production of low cost printed circuits.

Other objects of the invention will be pointed out in the following description and claims and illustrated in the accompanying drawings, which disclose, by way of examples, the principle of the invention and the best mode which has been contemplated, of applying that principle.

In the drawings:

Figs. 1*a*–1*h*, inclusive, depict the various steps followed to manufacture a printed circuit according to the present invention.

According to the National Bureau of Standards publication 468 entitled "Printed Circuit Techniques" and which issued on November 15, 1947, electric circuits are defined as being printed when they are produced on an insulated surface by any process or method. Furthermore, since printing may be defined as the act of reproducing a design upon a surface, these aforesaid processes and methods are generally classified as printing techniques. Accordingly, these printing techniques, such as painting, spraying, chemical processes, etc., for producing electrical printed circuits are simply different ways of reproducing a circuit design upon an insulated surface whereby the electrical wiring is reduced to essentially two dimensions.

*General description*

Figure 1B:
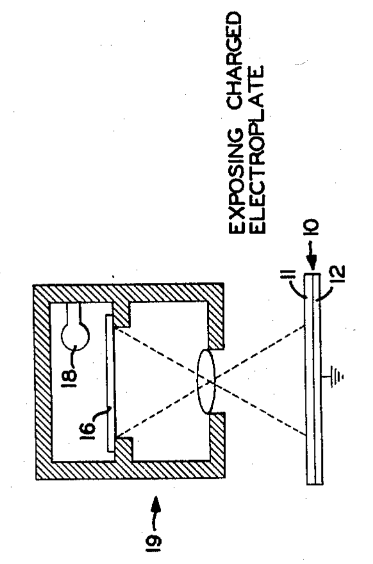

*Process.*—The present method of producing printed circuits includes as a part thereof an electrophotographic printing technique such as is disclosed in the Carlson Patents Nos. 2,297,691 and 2,357,809, which issued on November 19, 1940, and September 12, 1944, respectively. Referring to Fig. 1*a* for an explanation of the present method for manufacturing printed circuits, an electrophotoplate 10 comprised of a photoconductive insulator 11 and a conductive backing 12 therefor, is charged in a light absent chamber (not shown) by a corona discharge wire 13 connected to a source 14 of suitable electrical energy. The photo-conductive insulator 11 which might be amorphous selenium, for example, is generally charged positive to a potential of approximately 800 volts. Next, the charged electrophotoplate 10 is subjected to a positive optical image of the electrical circuit 16 (Fig. 1*b*) to be printed. By connecting the conductive backing 12 to ground potential, a latent electrostatic image corresponding to the design 17 (see also Fig. 1*c*) of circuit 16 (Fig. 1*b*) will be produced on the electrophotoplate for the reason that those electrically charged incremental areas of the photoconductive layer 11 onto which light rays from light source 18 are directed become discharged, whereas those areas not illuminated by the light rays remain charged. It would be well to point out here that the image projector 19 and electrophotoplate 10 are confined to a darkened chamber (not shown) so that a latent electrostatic image may be formed and the entire electrophotoplate not discharged.

After the positive latent electrostatic image of the circuit design 17 has been formed in electrophotoplate 10, the electrophotoplate is placed in an image developing apparatus such as the one shown and described in Sabel Patent No. 2,550,724, which issued on May 1, 1951. Referring to Fig. 1*c*, this developing apparatus (not shown) causes a quantity of image developer material 21 which includes as a part thereof a resinous, acid resistant, electric insulator powder, to cascade over the surface of photoconductive layer 11 from a hopper 22 to a receiving chamber 23. An acid resistant powder which is suitable for developing latent electrostatic images, is described in Copley Patent No. 2,659,670, which issued on November 17, 1953, and Walkup et al. Patent No. 2,638,416, which issued on May 12, 1953. Such a powder is commercially available from the Haloid Company of Rochester, New York, under the trade name BXT–75. Due to the fact that the powder is an electric insulator, i.e., electrically non-conductive, powder particles are caused to adhere to charged portions of the surface of photoconductive layer 11 defining the latent electrostatic image so as to visibly define the same which corresponds to the design 17, by a powder image 24. As is brought out in the aforementioned Walkup et al. patent, the powder particles may have a negative triboelectric charge imparted thereto by carrier particles also included in the developer, thereby effecting even greater attraction between the positive latent electrostatic image and the negative powder particles.

The developed powder image 24 (Fig. 1*d*) appearing on the surface of photoconductive layer 11 now visibly defines the design of the electric circuit to be printed, as stated previously. Hence, the electrophotoplate may now be exposed to light since it does not matter any more whether the latent elecetrostatic image is destroyed or not inasmuch as the developed powder image has been formed. This developed powder image 24 is next transferred to a transfer sheet 26 having a gelatin-like flaccid coating 27 (see also Fig. 2) thereon. A transfer sheet suitable for use in this step of the present process, is commercially available photographic paper which has its gelatin coating wetted to make the same flaccid. As will be brought out in detail shortly, the coating on the transfer sheet must not simply be an adhesive coating for causing the developed powder image 24 to adhere thereto, but must be comprised of material which will permit the powder image to be re-transferred from the transfer sheet onto a conductive metal foil surface. The developed powder image 24 (Fig. 1*d*) on the surface of electrophotoplate 10 may be transferred to the coated side of transfer sheet 26 by means of a movable pressure roller 28. As a result of the performance of this step, when the transfer sheet 26 is peeled away from the electrophotoplate surface, the powder particles defining the powder image 24 will be embedded to some extent within the coating 27, and will therefore be removed from the electrophotoplate surface.

Once having the developed powder image 24 (see Fig. 1*e*) of design 17 deposited on the coated surface of transfer sheet 26, the powder particles defining the said image must be treated for the aforementioned re-transfer step onto the surface of a conductive metal foil 29 of a composite sheet 31, said sheet generally being comprised of a rigid insulation board backed metal foil. The powder particles making up the image may be so treated for re-transfer by being affixed to the surface of the metal foil. This is done by subjecting the powder to the vapor of a chemical solvent therefor, for example, so that the portion of the powder not in contact with the transfer sheet 27 is caused to soften. Thus, inasmuch as the powder is a resinous material, it will become tacky when softened and when transferred will stick to the surface of metal foil 29. Referring to Fig. 1*e* once again, this re-transfer step is preferably accomplished by placing the composite sheet 31 in a suitable container or pan 32 having therein a quantity of a chemical solvent for the powder. A suitable solvent for this purpose is trichloro-monofluoro-methane ($CCl_3F$). This solvent is heated by a heating element 33, so that the vapors of the solvent completely envelop the composite sheet 31. As the transfer sheet 26 having the powder image 24 thereon is brought over the large opening in pan 32, the image defining powder is subjected to the solvent vapor and is thereby caused to soften. As a result, the powder particles not in contact with the transfer sheet or the exposed portion thereof become tacky so that when the gelatin-like flaccid coated side of transfer sheet 26 is brought into intimate contact with the surface of metal foil 29 by the movable pressure roller 34, the chemically treated powder is caused to adhere to the said metal foil surface. Since the gelatin-like flaccid coating 27 (Fig. 2) is a material which seals off the embedded portion of the powder particles from the solvent vapor, and since this coating is less adhesive than are the softened particles as will be explained shortly, the powder image 24 will remain on the surface of metal foil 29 when the transfer sheet 26 is peeled away from the composite sheet 31.

In view of the fact that the powder particles making up image 24 are, as yet, unintegrated, separated particles, it is now necessary to "permanently" affix the powder image onto the metal foil surface of composite sheet 31 so as to fill in any spaces appearing between these separated particles. This may be done by subjecting the powder image to heat produced by a heating element 36 or to the vapor of a powder solvent for an added period. Be it heat or the solvent vapor, the solid powder particles will, of course, be changed to a softened, molten state. Upon removal of the heat or the solvent vapor, depending upon which is used for the fixing operation, there will remain a solid, acid resistant coating 37 (Fig. 1*f*) on the metal foil surface of composite sheet 31, which coating will define a design that corresponds in every respect to the original circuit design 17 (see also Fig. 1*b*).

By now placing the composite sheet 31 (Fig. 1*f*) into another container or pan 38 having a suitable etchant therein for etching the exposed metal foil 29, the non-coated portion of the metal foil will be etched out. Thus, if the metal foil 29 is made of copper, for example, a suitable etchant is ferric-chloride ($FeCl_3$). The coated portions of the metal foil which are covered and actually defined by solid powder coating 37, will not be etched out since, as stated previously, the powder material making up the coating is acid resistant. Of course, the insulting backing 39 of composite sheet 31 is also acid resistant.

After the non-coated portion of the surface of metal foil 29 has been etched out, the coating 37 can be removed in order to expose the electric printed circuit thereunder defined by the remaining metal foil. This may be done by placing the etched sheet 31 (Fig. 1g) in a still another container or pan 41 having a chemical solvent therein for the coating 37, which solvent may once again be trichloro-monofluoro-methane. This will cause the powder coating 37 to soften once again, and upon removing the coating, there will appear an electrical printed circuit 42 (Fig. 1*h*) having an electrically conductive circuit design 43 similar to design 17 of circuit 16 (see also Figs. 1*b* and 1*c*) supported by an insulation backing plate 39.

*Transfer sheet.*—As described previously, the developed powder image 24 (Fig. 1*c*) is transferred to a transfer sheet 26 (Fig. 1d) having a gelatin-like flaccid coating 27 (see also Fig. 2) thereon. Limitations in the English language as well as a poor understanding of just what does take place, have made it extremely difficult to properly define this coating in one or two words, because this coating must possess the following properties.

Figure 1D:
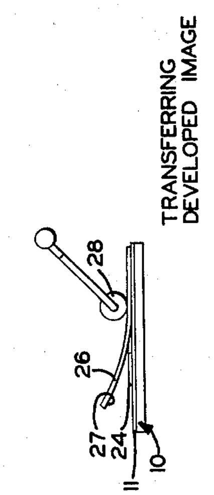
Figure 1A:
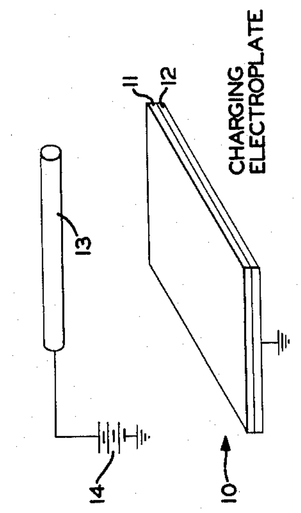
Figure 1C:
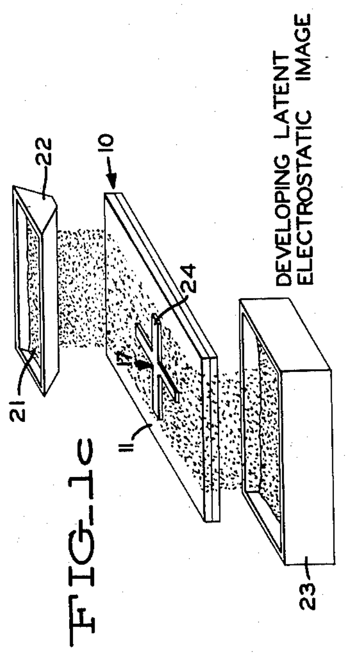
Figure 1F:
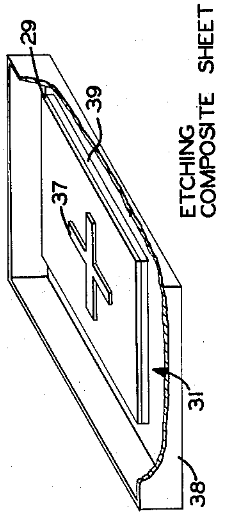
Figure 1H:
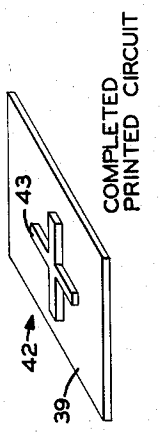
Figure 1E:
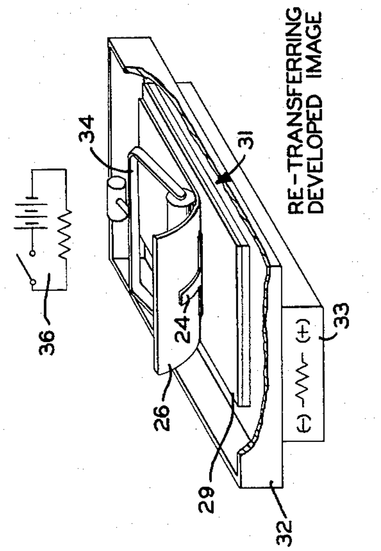
Figure 1G:
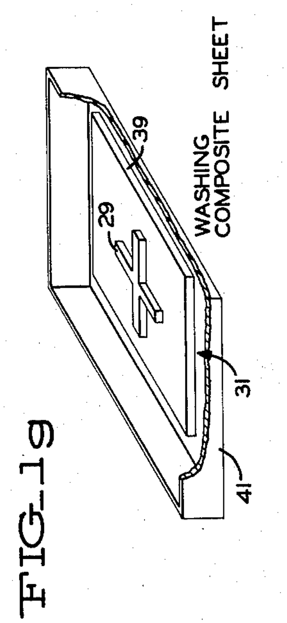

(1) It must be sufficiently adhesive to remove practically all of the image defining powder particles from the surface of electrophotoplate 10 (see Fig. 1*d*).

(2) It must be of a consistency such that the portion of the powder particles embedded therein, are sealed off from the atmosphere. Furthermore, it should be "pliable" so as to allow contact with all of the powder particles in multi-layers.

(3) It should preferably be composed of materials which are not responsive to the vapors of the powder solvent in order that none of the coating is transferred onto the metal foil surface of board 31 (Fig. 1*e*).

(4) In line with the foregoing, if the coating is caused to be transferred onto the metal foil surface, it should preferably be composed of materials which are not acid resistant.

(5) It should provide a lesser adhesive force than do the softened, tacky powder particles when brought into physical contact with the metal foil surface of board 31 (Fig. 1*e*), so that practically all of the image defining powder particles may be re-transferred onto the metal foil surface.

Commercially available photographic "positive print" paper, affords excellent results. When the gelatin coating thereon is wetted, there is a transfer of nearly all of the image defining powder particles from the electrophotoplate surface, and yet a re-transfer of nearly all of these powder particles onto the metal foil surface of the board 31. The gelatin coating is not chemically active with the vapors of the powder solvent, so that (*a*) none of the gelatin coating appears to be transferred onto the metal foil surface to possibly hinder the acid etching operation and (*b*) the embedded portions of the powder particles are sealed off from these vapors to prevent, among other things, a permanent affixing of these powder particles onto the transfer sheet itself.

The aforementioned photographic paper affords poor results when the coating thereon is not wetted and dry, as do either wet or dry ordinary uncoated papers. That is, there is very little powder transfer from the electrophotoplate surface. A rubber roll, for example, provides fairly good transfer from the electrophotoplate surface onto the surface of the roll, but extremely poor re-transfer therefrom onto the metal foil surface. In fact, it appears that the powder particles are permanently affixed to the surface of the rubber roll as a result of softening the powder image thereon. Most plastic material sheets are unsuitable for use as the transfer sheet because they are responsive chemically to the vapors of the powder solvent.

It should be pointed out that the transfer and re-transfer steps depicted by Figs. 1*d* and 1*e*, are necessary in view of the fact that the electrophotoplate 10 and the composite sheet 31 are each generally rigid board-like members. As a result, not all of the surface areas thereof would be in intimate contact should a direct powder image transfer from the electrophotoplate surface to the composite sheet metal foil surface be attempted. Accordingly, there would result a poor and very uneven powder transfer. Another reason for using a transfer sheet such as the one described herein, is to avoid possible damage to the delicate insulating layer 11, e.g., amorphous selenium, on electrophotoplate 10 (see Fig. 1*d*). That is, if the transfer of the image defining powder particles were to be made directly onto the metal foil surface of the composite sheet 31, the photoconductive insulating layer 11 would more than likely become scratched and mutilated.

As stated previously, it is not too clear just what takes place so that the aforesaid photographic paper is adaptable for both the transfer and re-transfer steps. It is believed, however, that the coating 27 (Fig. 2) seals off the embedded portion of each powder particle from the atmosphere, there being one such particle shown in Fig. 2 for descriptive purposes. Thus, when the transfer sheet 26 is subjected to the solvent vapor, only the exposed portion of each powder particle is softened and caused to become tacky. By bringing the powder image carrying surfaces of sheet 26 into intimate contact with the metal foil surface to be etched, there is a greater adhesive force between the exposed tacky portions of the powder particles than there is between the coating 27 and the embedded portions thereof. Accordingly, the powder particles remain on the metal foil surface when the transfer sheet 26 is peeled therefrom.

*Machine description*

Figures 2, 3:
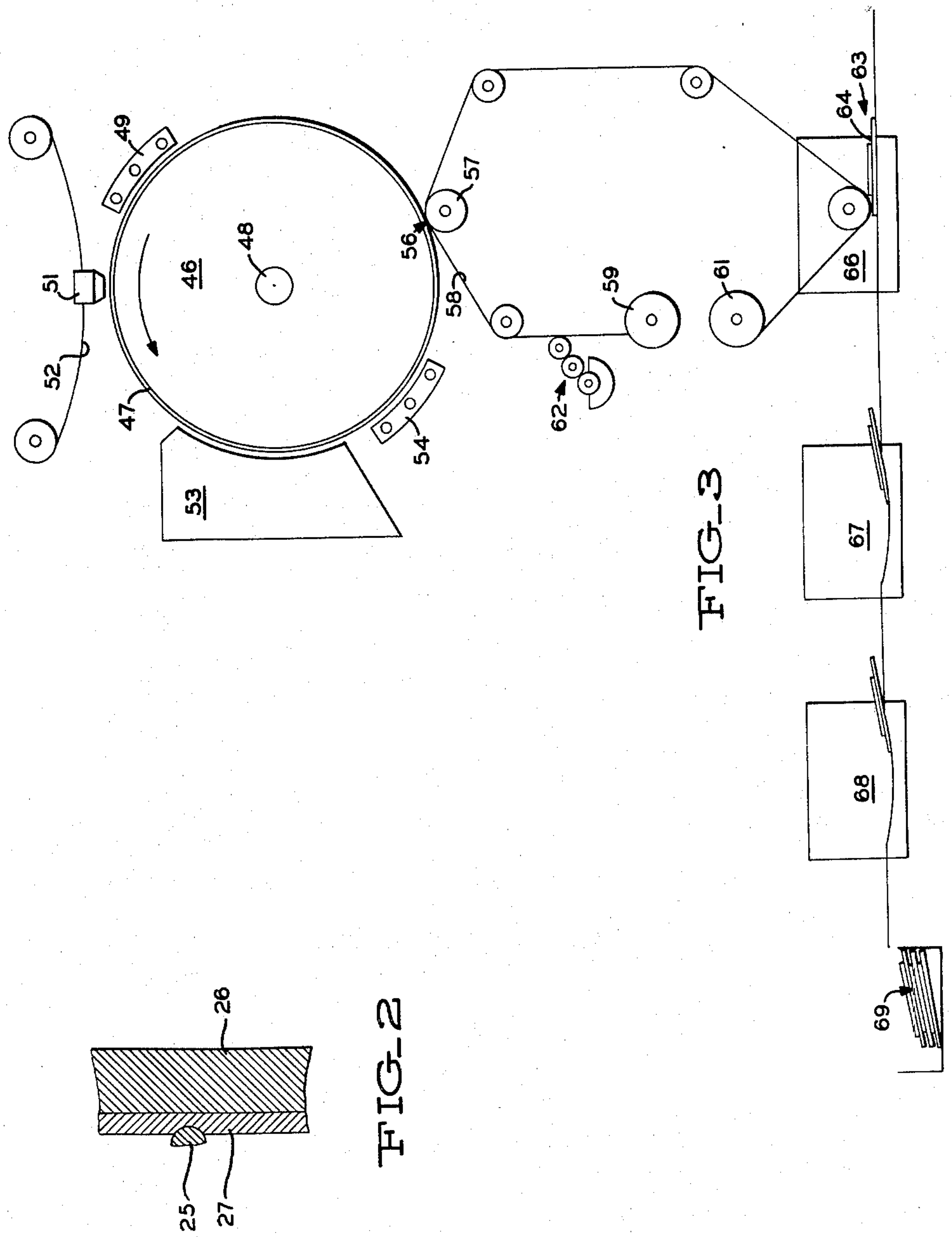
Fig. 2 is a cross-sectional view of a portion of a transfer sheet having a gelatin-like flaccid coating thereon for use in the present process.
Fig. 3 shows apparatus for producing printed circuits automatically in accordance with the present invention.

The present process for manufacturing electrical printed circuits is adaptable to automation as is shown in Fig. 3, whereby the printed circuits may be produced automatically. Furthermore, it will become evident as the description advances that printed circuits of similar or different design can be manufactured selectively. Referring to Fig. 3, an electrophotographic drum 46 having secured thereto a flexed electrophotoplate 47, is driven in a counterclockwise direction by an electric motor (not shown) via the drive shaft 48. As successive incremental surface areas of the electrophotoplate are moved past an ion-producing charging unit 49 of the type shown and described in Carlson Patent No. 2,588,699, which issued on March 11, 1952, the photoconductive surface of the electrophotoplate is electrically charged positive. After being so charged, the aforesaid incremental areas are moved past an optical image producing unit 51 which directs an optical image of a circuit to be printed onto the charged surface of drum 46. The optical image can be produced in any one of a number of ways. For example, the arrangement may be one wherein a microfilm strip 52 is moved in a step-by-step, or frame-by-frame, fashion past the optical unit 51 in order that an image of each frame of the microfilm strip 52 is projected onto the surface of the charged electrophotoplate 47. Consequent upon the exposure of this surface to the optical image projected thereon by unit 51, a latent electrostatic image thereof is produced on the electrophotoplate surface.

Continued rotation of the drum 46 in a counterclockwise direction will then move the drum surface area having the latent electrostatic images thereon into a developing chamber 53 that may be similar to the cascade type device utilized in the printing apparatus of Schaffert Patent No. 2,576,047, which issued on November 20, 1951. This image developing chamber is one wherein the resinous, acid resistant, electric insulator powder image of the latent electrostatic image is developed on the electrophotoplate surface of drum 46. A still further counterclockwise movement of the drum 46 will cause the developed powder images on the surface thereof to move out of developing chamber 53, and past a negative corona ion-producing unit 54 which is substantially similar to unit 49. The unit 54 decreases the magnitude of the electrical charge defining the positive latent electrostatic image, to thereby condition the developed powder image carried on the electrophotoplate surface of drum 46 for removal therefrom at a transfer station 56. This transfer station includes a pressure roller 57 for effecting intimate line or tangential contact between a wetted transfer web 58, such as the aforementionel commercially available photographic paper for example, and the surface of drum 46. As is shown, the transfer web 58 is fed from a supply reel 59 to a take-up reel 61 at a lineal speed which will be the same as the peripheral speed of drum 46. Any conventional wetting mechanism 62 may be used to wet the gelatin-like flaccid coating on transfer web 58. Hence, the developed powder image on the surface of drum 46 will be transferred to the wetted coated side of transfer web 58, at transfer station 56.

In view of the fact that the composite sheets 63, each of which is comprised of an insulation member and a metal foil layer 64, are moved one-by-one through a powder solvent vapor filled chamber 66 in a timed relationship with the lineal speed of transfer web 58, each softened powder image carried on the coated side of the transfer web will be re-transferred onto the surface of metal foil 64. The solvent vapor will further act to fix the powder image adhering to the metal foil surface of composite sheet 63 so that a continuous acid resistant coating will be formed over the metal foil 64. This coating will, of course, define the circuit to be printed. The composite sheets having the circuit design coating thereon may be moved by any suitable conveyor mechanism through a chamber 67 having a suitable etchant therein for removing the non-coated portions of the metal foil 64, and then through a chamber 68 having a suitable solvent therein for removing the "fixed" powder coating over the remaining metal foil so as to expose the conductive circuit design thereunder. This having been done, the printed circuit plates 69 can be stacked in any conventional fashion for subsequent use.

While there have been shown and described and pointed out the fundamental novel features of the invention as applied to a preferred embodiment, it will be understood that various omissions and substitutions and changes in the form and details of the process described, of the device illustrated and the operation thereof, may be made by those skilled in the art, without departing from the spirit of the invention. It is the intention, therefore, to be limited only as indicated by the scope of the following claims.

What is claimed is:

1. In the method of manufacturing printed circuits which comprises exposing an electrostatically charged photoconductive insulating surface to a light image of the desired circuit pattern to form a latent electrostatic image of said pattern, developing the latent electrostatic image with an acid resistant powder and transferring said acid resistant powder image thereby developed to an acid etchable metallic surface, and etching the uncovered portions of the metallic surface, the improvement which comprises transferring said developed powder image from said photoconductive insulating surface to a flaccid transfer sheet by pressing the surface of said sheet against the developed powder image on said photoconductive insulating surface, said surface of said transfer sheet having the property of adhering to the developed image with a tenacity greater than that of the image to the photoconductive insulating surface, the surface of said transfer sheet being sufficiently pliable to allow contact with the entire powder image which has one portion embedded in the surface of the transfer sheet and another portion projecting therefrom when said pressure is applied; exposing said another portion to a vapor of a solvent therefor to make said another portion tacky without dissolving the same, said one portion embedded in the surface of said transfer sheet remains unaffected by said vapor of said solvent; retransferring said powder image by bringing said tacky another portion into contact with said metallic surface and pressing upon said transfer sheet so that said tacky another portion contacts the metallic surface and dislodges said embedded one portion from the transfer sheet during the removal thereof; and fusing said one and another portions to the metallic surface before etching.

2. In the method of manufacturing printed circuits according to claim 1 wherein said one and another portions are fused to the metallic surface before etching by subjecting said one and another portions to the vapor of a solvent therefor until fused.

3. In the method of manufacturing printed circuits according to claim 1 wherein said one and another portions are fused to the metallic surface before etching by applying heat to said one and another portions.

4. In the method of manufacturing printed circuits according to claim 1 wherein said another portion is exposed to heat so as to become tacky without being dissolved and whereby said one portion embedded in the surface of said transfer sheet remains unaffected by said heat.

References Cited in the file of this patent

UNITED STATES PATENTS

| | | |
|---|---|---|
| 753,097 | Palm et al. | Feb. 23, 1904 |

| | | |
|---|---|---|
| 2,297,691 | Carlson | Oct. 6, 1942 |
| 2,357,809 | Carlson | Sept. 12, 1944 |
| 2,602,731 | Nierenberg | July 8, 1952 |
| 2,624,652 | Carlson | Jan. 6, 1953 |
| 2,637,651 | Copley | May 5, 1953 |
| 2,638,416 | Walkup et al. | May 12, 1953 |
| 2,681,473 | Carlson | June 22, 1954 |
| 2,692,190 | Pritikin | Oct. 19, 1954 |
| 2,756,143 | Murray | July 24, 1956 |
| 2,855,297 | Saunders | Oct. 7, 1958 |

OTHER REFERENCES

Sugarman: R.C.A. publication reprinted from Proceedings of the Seventh Annual Meeting of the Graphic Arts, pp. 7–10 (May 1955).

Oughton: The Glass Industry, pages 662–664 and 684 (December 1949).